(12) United States Patent
Lin et al.

(10) Patent No.: US 11,373,878 B2
(45) Date of Patent: Jun. 28, 2022

(54) TECHNIQUE FOR SEMICONDUCTOR MANUFACTURING

(71) Applicant: TAIWAN SEMICONDUCTOR MANUFACTURING COMPANY LTD., Hsinchu (TW)

(72) Inventors: Han-Yu Lin, Nantou County (TW); Li-Te Lin, Hsinchu (TW); Tze-Chung Lin, Hsinchu (TW); Fang-Wei Lee, Hsinchu (TW); Yi-Lun Chen, Taichung (TW); Jung-Hao Chang, Taichung (TW); Yi-Chen Lo, Hsinchu County (TW); Fo-Ju Lin, Keelung (TW); Kenichi Sano, Hsinchu (TW); Pinyen Lin, Rochester, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/153,609

(22) Filed: Jan. 20, 2021

(65) Prior Publication Data
US 2022/0020595 A1    Jan. 20, 2022

Related U.S. Application Data

(60) Provisional application No. 63/052,880, filed on Jul. 16, 2020.

(51) Int. Cl.
*H01L 21/311* (2006.01)
*H01L 21/3065* (2006.01)

(52) U.S. Cl.
CPC .... *H01L 21/31116* (2013.01); *H01L 21/3065* (2013.01)

(58) Field of Classification Search
None
See application file for complete search history.

(56) References Cited

U.S. PATENT DOCUMENTS

| | | | | |
|---|---|---|---|---|
| 4,438,556 A | * | 3/1984 | Komatsu | H01L 21/32137 257/E21.312 |
| 5,294,568 A | * | 3/1994 | McNeilly | C04B 41/5346 148/DIG. 17 |
| 5,783,495 A | * | 7/1998 | Li | H01L 21/02068 438/738 |

(Continued)

OTHER PUBLICATIONS

De Yoreo, J. J. et al., Principles of Crystal Nucleation and Growth, Reviews in Mineralogy and Geochemistry, 54(1), 57-93, Jan. 3, 2003.

*Primary Examiner* — Allan W. Olsen
(74) *Attorney, Agent, or Firm* — WPAT, P.C., Intellectual Property Attorneys; Anthony King

(57) ABSTRACT

A technique for semiconductor manufacturing is provided. The technique includes the operations as follows. A semiconductor structure having a first material and a second material is revived. The first material has a first incubation time to a first etching chemistry. The second material has a second incubation time to the first etching chemistry. The first incubation time is shorter than the second incubation time. A first main etch to the semiconductor structure for a first duration by the first etching chemistry is performed. The first duration is greater than the first incubation time and shorter than the second incubation time.

20 Claims, 17 Drawing Sheets

(56) References Cited

U.S. PATENT DOCUMENTS

| | | | |
|---|---|---|---|
| 6,746,615 B1* | 6/2004 | Ellis | C03C 15/00 |
| | | | 216/57 |
| 2013/0196497 A1* | 8/2013 | Shimada | H01L 21/28079 |
| | | | 438/591 |
| 2014/0273492 A1* | 9/2014 | Anthis | C23F 1/12 |
| | | | 438/720 |
| 2017/0207066 A1* | 7/2017 | Park | H01J 37/32935 |
| 2021/0242031 A1* | 8/2021 | Zandi | H01L 21/0228 |

* cited by examiner

TECHNIQUE FOR SEMICONDUCTOR MANUFACTURING

CROSS REFERENCE TO RELATED APPLICATION

This application claims the benefit of prior-filed U.S. provisional application No. 63/052,880, filed on Jul. 16, 2020, and incorporates its entirety herein.

FIELD

The present disclosure relates to a technique for dry etching, particularly, the technique is related to chemical dry etching (CDE) operation.

BACKGROUND

In dry etching, plasmas or etchant gases remove the material on the substrate. The reaction that takes place can be done utilizing high kinetic energy of particle beams, chemical reaction, or a combination of both.

Dry etching may include physical component and chemical component. Physical component requires high kinetic energy particle or ion beams to bombard surface atoms. When the high energy particles knock out the atoms from the surface, the material turns into gaseous phase and being evacuated after leaving the surface. In contrast, chemical component uses a chemical reaction between etchant gases and the surface material. Products of the chemical reaction may be subsequently removed from the etching chamber.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
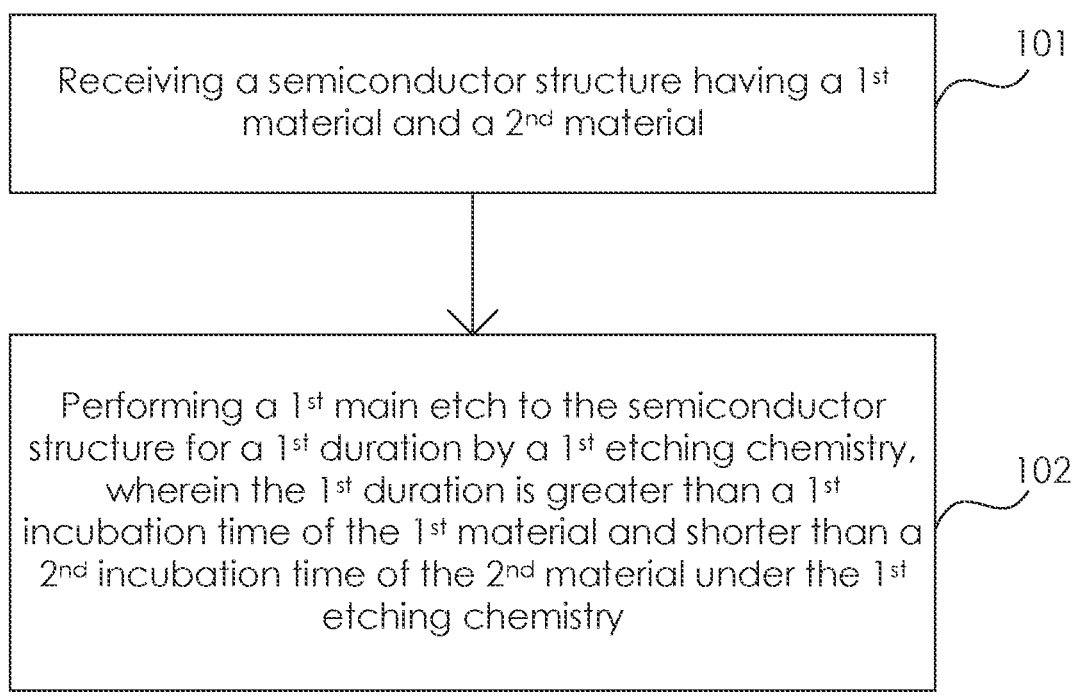
FIG. 1 illustrates a flow chart of a technique for semiconductor manufacturing, according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

When critical dimensions of semiconductor structures are decreased, more and more applications require selective, isotropic, and nearly damage-free etching. As architecture changed from FinFET to nano-sheet, for example, two additional operations occur for lateral silicon germanium (SiGe) etching with selectivity to silicon (Si). The high energy ion bombardment from plasma-based processes may suffer several problems including: (1) low etch selectivity; (2) limited lateral etching capability; and (3) defects degrading the quality of the structure. Even though some wet etching techniques could alleviate these concerns, limited within-wafer uniformity tuning, profile decoration and narrow gap etching capability still constrained their applications.

An alternative strategy is chemical dry etch (CDE) by either gaseous or radical species. The radical fluxes can be produced by a remote plasma source (RPS), in which flow distance or the use of grids largely eliminates ion fluxes and delivers neutral radicals into the process chamber where the wafer is placed. Generally, each of the etching cycles/periods in CDE is no less than 3 seconds by taking uniform chemisorption and plasma stability into consideration.

Generally speaking, four categories of parameters or tuning knobs can be implemented for suitable etching result, namely, chemistry (e.g., radical or gas species, power of remote plasma source), temperature (e.g., lid/wall temperature for gaseous phase reaction, wafer temperature for gaseous/solid surface reaction), pressure (e.g., adsorption/desorption), and cyclic operation with each cycle no less than 3 seconds. The aforesaid four tuning knobs, however, cannot meet the demand of high and reversible etching selectivity, and cannot produce fine feature profile decoration due to unavoidable non-uniform by-product accumulation and different etching incubation time for different material species.

Accordingly, the present disclosure provides a new technique for manufacturing a semiconductor structure by using fast assess cyclic switching (FACS) technique. FACS may be performed based on a CTE operation. In some embodiments, FACS may shorten the minimum acceptable etching duration per cycle/period down to 1 second. Such novel technique enables high and reversible etching selectivity through incubation time engineering. In addition. FACS can make significant progress in developing the profile decoration such as de-smiling, depth variation and surface roughness.

FIG. 1 illustrates a flow chart of manufacturing a semiconductor structure according to some embodiments of the present disclosure. In some embodiments, the manufacturing technique includes an operation 101: receiving a semiconductor structure having a first material and a second material; and an operation 102: performing a first main etch to the semiconductor structure for a first duration by a first etching chemistry, wherein the first duration is greater than a first incubation time of the first material and shorter than a second incubation time of the second material under the first etching chemistry. For example, the manufacturing technique is implemented under the circumstances that the first material having a first incubation time to the first etching chemistry, the second material having a second incubation time to the first etching chemistry, and the first incubation time is shorter than the second incubation time. The first duration that the first main etch lasts is greater than the first incubation time and shorter than the second incubation time, so that a high etching selectivity between the first material and the second material can be achieved.

In some embodiments, the first material includes silicon or silicon compounds such as silicon nitride (SiN), silicon carbon nitride (SiCN), silicon dioxide ($SiO_2$), silicon oxycarbonitride (SiOCN), silicon carbide (SiC), or SiGe. In some embodiments, the first material includes other oxides, nitrides, or conductive materials that used in forming the semiconductor structures. In some embodiments, the second material includes silicon or silicon compounds such as SiN, SiCN, $SiO_2$, SiOCN, SiC, or SiGe. In some embodiments, the second material includes other oxides, nitrides, or conductive materials that used in forming the semiconductor structures. In some embodiments, the first material is different from the second material.

Figure 2A:
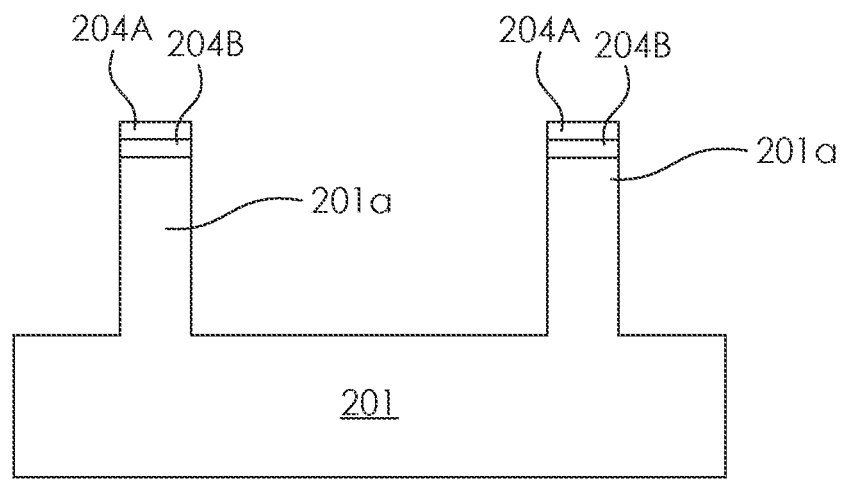
FIG. 2A illustrates a cross-sectional view of an intermediate semiconductor structure when performing the technique for semiconductor manufacturing, according to some embodiments of the present disclosure.
Figure 2B:
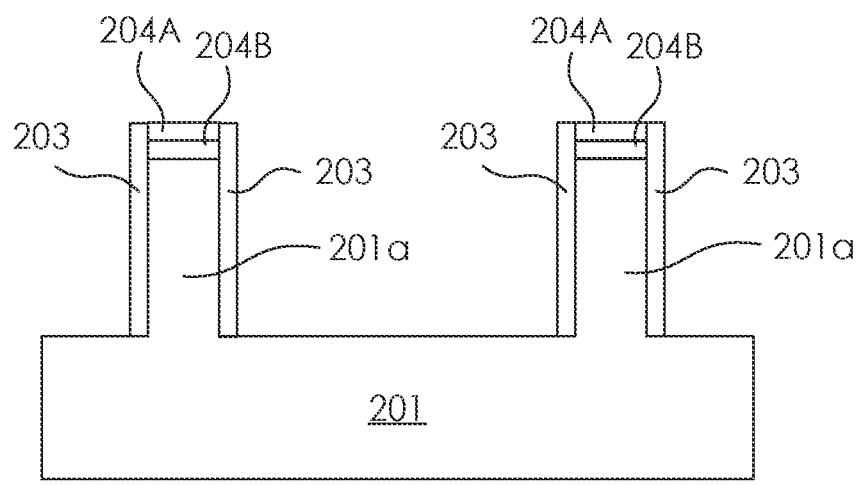
FIG. 2B illustrates a cross-sectional view of an intermediate semiconductor structure when performing the technique for semiconductor manufacturing, according to some embodiments of the present disclosure.
Figure 2C:
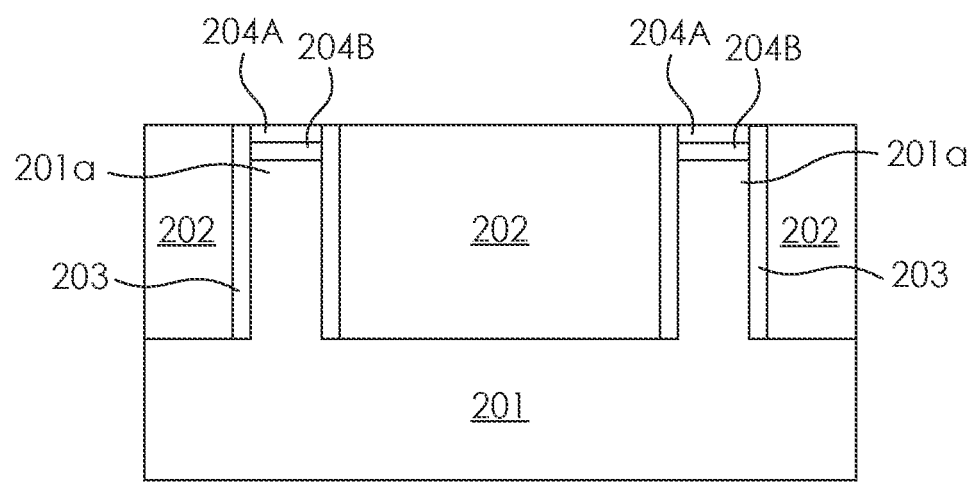
FIG. 2C illustrates a cross-sectional view of an intermediate semiconductor structure when performing the technique for semiconductor manufacturing, according to some embodiments of the present disclosure.
Figure 2D:
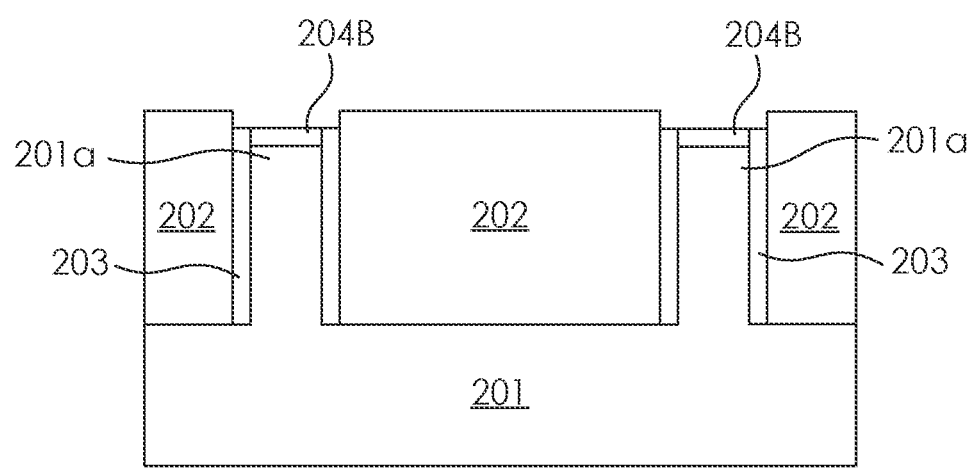
FIG. 2D illustrates a cross-sectional view of an intermediate semiconductor structure when performing the technique for semiconductor manufacturing, according to some embodiments of the present disclosure.
Figure 2E:
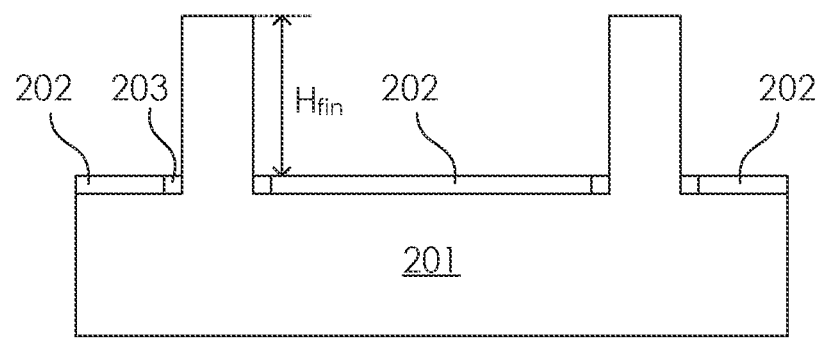
FIG. 2E illustrates a cross-sectional view of an intermediate semiconductor structure when performing the technique for semiconductor manufacturing, according to some embodiments of the present disclosure.

Under a predetermined etching chemistry, different materials (e.g., first material serving as a material to be etched and second material serving as an etch stop) do not necessary show sufficient etching selectivity when the duration of main etch is greater than both the first incubation time of the first material and the second incubation time of the second material. Present disclosure provides an etching technique for semiconductor manufacturing to shorten the duration of the main etch so that the duration of the main etch can be shorter than the second incubation time and longer than the first incubation time. This incubation time engineering can effectively increase the etching selectivity between the first material and the second material. FIGS. 2A to 2E shows a shallow trench isolation (STI) recess etching operation implementing the present etching technique. In FIG. 2A, a pad oxide 204B and a pad SiN 204A are formed over a silicon substrate 201. Next, a plurality of fins 201a are formed over the silicon substrate 201 by a suitable patterning operation. The unremoved portions of pad oxide 204B and the pad SiN 204A are remained on the each of the fins 201a after the patterning operation. In FIG. 2B, an STI liner 203 is selectively grown on the sidewall of the fin 201a, for example, by a SiN selective deposition operation. In FIG. 2C, the STI oxides 202 may be formed to cover the silicon substrate 201 and fill the space between the fins 201a. In FIG. 2D, the pad SiN 204A and a portion of the STI liner 203 may be removed by, for example, $H_3PO_4$. In FIG. 2E, the STI oxides 202 is recessed by an etching back operation and thereby define the fin height $H_{fin}$. The fin height $H_{fin}$ as well as the shape of the fin 201a are important dimensions to be controlled because those may affect the electrical properties of transistors, e.g., the threshold voltage ($V_{th}$) and turn-on power etc. In some embodiments, the pad oxide 204B may be removed after etching back the STI oxides 202.

In order to etch the STI oxides 202 made by silicon dioxide, hydrogen fluoride (HF) based chemistry is used, for instance, $HF/NH_3$ mixture is used for $SiO_2$ etching. Note the aforesaid $HF/NH_3$ chemistry can also remove STI liner 203 (e.g., SiN) while performing STI oxides 202 etch back. Under the circumstances that the material of the fins 201a includes silicon while the material of the STI oxides 202 includes $SiO_2$, the post-etch profiles of the fins 201a may be affected during the etching operation of the STI oxides 202 if the etching selectivity between $SiO_2$ and Si is not sufficiently high. Accordingly, the present disclosure reduces the duration of the main etch so that said duration is shorter than an incubation time of the material not intended to be etched. The etching selectivity between the materials to be etched and materials not intended to be etched may thus be increased significantly.

The incubation time of a material referred in the present disclosure means the time required before observable etching result occurs to that particular material. Alternatively stated, no observable etching result may occur if the etching duration is shorter than the corresponding incubation time. Generally, four stages may occur during the incubation time: (a) gas phase diffusion; (b) adsorption (physisorption); (c) surface diffusion; and (d) surface reaction (chemisorption). Physisorbed reactants are moving around the surface when they are attached by Van der Waals force, which is weak and easily desorbed, and then some of them are trapped by dipole moment force. If they find the dangling bond before they desorbed, the chemisorption is started then. Once chemisorption occurs and forms the byproducts such as ammonium fluorosilicate, the byproducts increased the probability to catch the reactants due to larger surface area then the reaction continues. For instance, by using $HF/NH_3$ mixture in $SiO_2$ etching, the gaseous HF and $NH_3$ may be applied to the etching chamber. Subsequently, the gaseous HF and $NH_3$ may physically adsorb on the surface of $SiO_2$. Next, the adsorbed gaseous HF and $NH_3$ may be bounded on the surface of $SiO_2$ and may be mobile only in two dimensions prior to forming the interface byproduct $(NH_4)_2SiF_6$ as follow:

$$6HF+2NH_3+SiO_2 \rightarrow (NH_4)_2SiF_6+2H_2O$$

That is, no observable etching result may occur to $SiO_2$ under $HF/NH_3$ chemistry until $(NH_4)_2SiF_6$ and water are formed, and the time spend during the step (a) to step (d) may be referred as the incubation time of $SiO_2$ to the corresponding etching chemistry $SIF/NH_3$.

Figure 3:
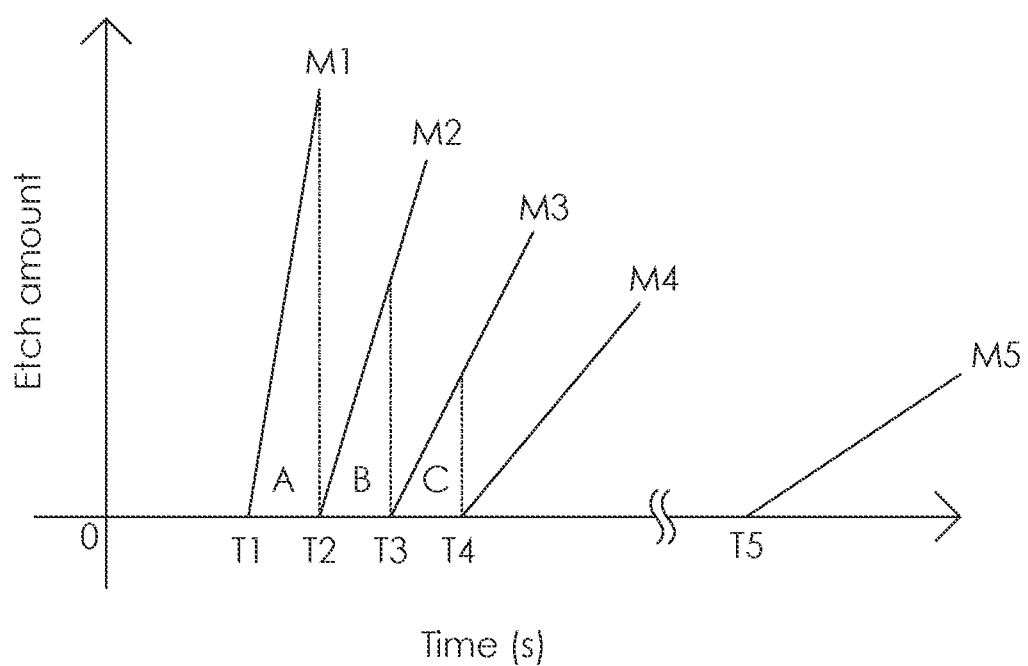
FIG. 3 illustrates a diagram showing etching amount with respect to etching duration for different material species according to some embodiments of the present disclosure.

FIG. 3 illustrates a diagram showing etching amount with respect to etching duration for different material species according to some embodiments of the present disclosure. Note all the material species demonstrated in FIG. 3 are under same etching chemistry, for example, under a first etching chemistry referred herein. In FIG. 3, a first material M1 has a first incubation time T1 and a second material M2 has a second incubation time T2, while the first incubation time T1 is shorter than the second incubation time T2. Likewise, a third material M3, a fourth material M4, and a fifth material M5 may further be included and each of them has a third incubation time T3, a fourth incubation time T4, and a fifth incubation time T5, respectively. As the example shown in FIG. 3, the incubation times T1, T2, T3, T4, T5 of the materials M1, M2, M3, M4, M5 are all different. Note the number of the materials to a specific etching chemistry may not limit as the example shown in FIG. 3, such figure is used to illustrate that different materials may have different incubation times, and the present disclosure utilize this feature to establish the FACS technique for acquiring extreme high and reversible etching selectivity.

Different etching chemistries lead to different combinations of the etching amount, incubation times, and material species, as illustrated in FIG. 3. For example, under the etching chemistry generating fluorine radicals ($F^-$), hydrogen radicals ($H^+$), and chlorine radicals ($Cl^-$), etching gases such as $NF_3$, $CF_4$, $SF_6$, $H_2$, $SiCl_4$, $BCl_3$, or $Cl_2$ can be used. In other embodiments, under the etching chemistry generating fluorocarbon radicals or oxygen radicals, the etching gases such as $CF_4$, $CF_2H_2$, $CF_3H$, $CFH_3$, $O_2$ or $CO_2$ can be used. By implementing a suitable etching chemistry and controlling the duration of main etch to be between two of the incubation times of the corresponding material species, the FACS technique described herein can be achieved.

Referring to FIG. 2A to FIG. 2E and FIG. 3, under the chemistry of $HF/NH_3$, the material species M1 in FIG. 3 can be $SiO_2$ with a first incubation time and any of the material species M2, M3, M4, or M5 in FIG. 3 can be Si with respective incubation times T2, T3, T4, or T5. Once the duration of main etch operation is within a range of from T1 to any one of T2, T3, T4, or T5, $SiO_2$ (the material species M1) may demonstrate observable etching result while the Si (the material species M2, M3, M4, or M5) does not show any observable etching result. Hence, Si may serve as an etch stop layer for $SiO_2$ and demonstrates high etching selectivity.

In some embodiments, under the etching chemistry including etching gases $NF_3$, $CF_4$, $SF_6$, $H_2$, $SiCl_4$, $BCl_3$, or $Cl_2$, material species M1 in FIG. 3 can be SiN with an incubation time T1 of about 1.0 second, and material species M2 in FIG. 3 can be SiCN with an incubation time T2 of about 1.5 seconds. As an example, once the duration of main etch operation is within a range of from T1 (e.g., about 1.0 second) to T2 (e.g., about 1.5 seconds) or within the time span A, SiN (the material species M1) may demonstrate observable etching result while the SiCN (the material species M2) does not show any observable etching result. Hence, once the duration of the main etch operation is controlled to be from 1.0 second to about 1.5 seconds, SiCN may serve as an etch stop layer for SiN and demonstrates high etching selectivity. Similarly, material species M3, M4, M5 with greater incubation time than that of SiN (the material species M1) can all serve as the etch stop layer under the aforesaid etching condition with even greater etching selectivity.

Further in such example, material species M3 in FIG. 3 can be SiOCN with an incubation time T3 of about 2.0 seconds, material species M4 in FIG. 3 can be Si with an incubation time T4 of about 2.5 seconds, and material species M5 in FIG. 3 can be $SiO_2$ with an incubation time T5 greater than 3 seconds. Similarly, both SiN and SiCN may be etched without consuming SiOCN or affecting the profile of SiOCN if the duration of main etch operation is less than about 2.0 seconds (i.e., covering the time span A and time span B). Similarly, during the time spans A, B, and C as shown in FIG. 3, SiN, SiCN, and SiOCN may be etched while both the Si and the $SiO_2$ can serve as an etch stop material. In other words, the present disclosure performs incubation times engineering by controlling the duration of main etch operation so as to enhance the etching selectivity. In some conventional approaches where FACS technique is not implemented, the duration of main etch is greater than 3 seconds. The etching selectivity between SiN and SiOCN or between SiN and SiCN are generally less than about 2:1. However, when implementing the FACS technique, the duration of main etch is controlled to be between 1.0 second to 1.5 seconds, and the etching selectivity between SiN and SiCN is higher than about 40:1 to about 50:1, similarly, the etching selectivity between SiN and SiOCN is higher than about 100:1.

Figure 4A:
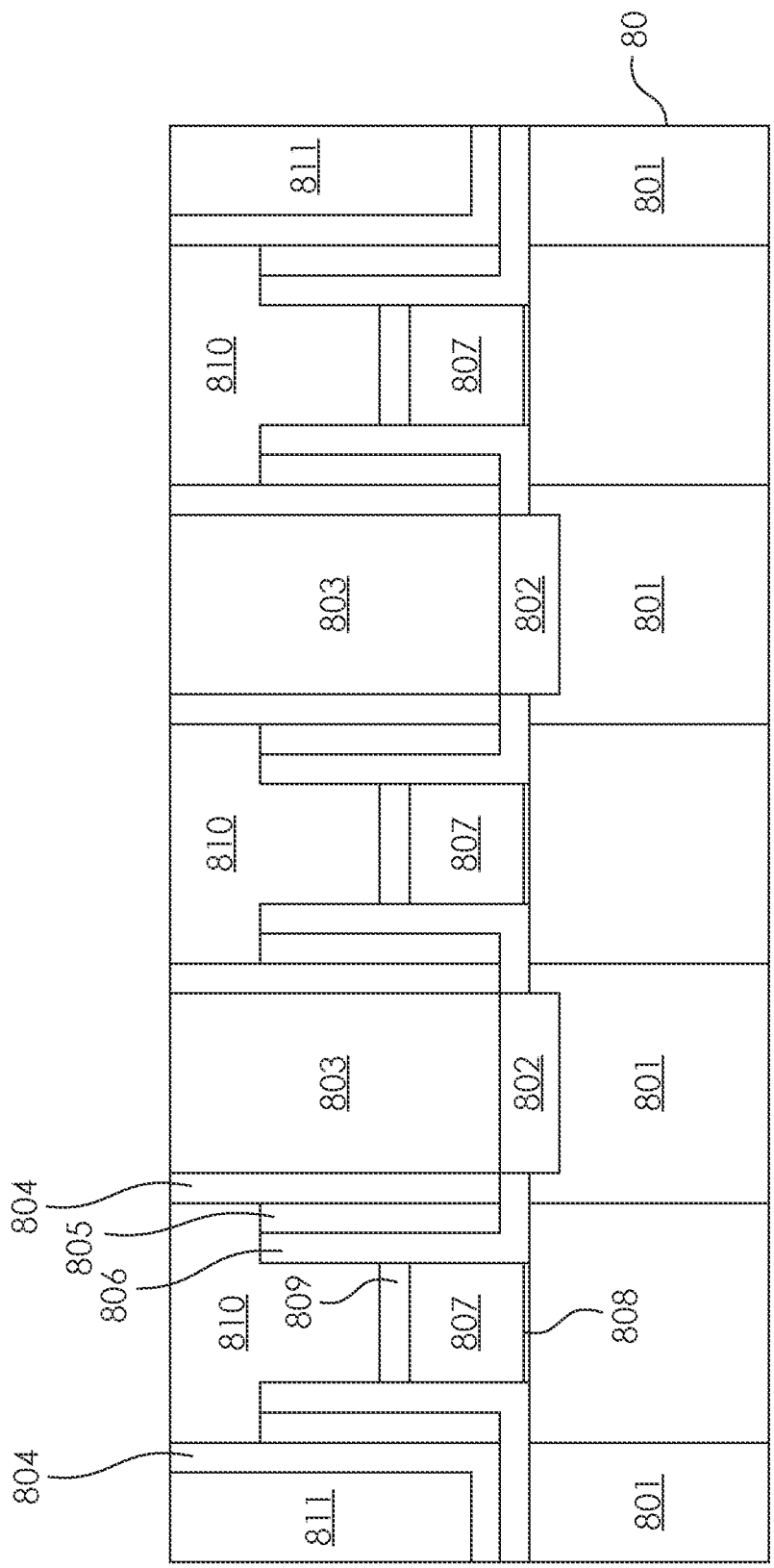
FIG. 4A illustrates a cross-sectional view of an intermediate semiconductor structure when performing the technique for semiconductor manufacturing, according to some embodiments of the present disclosure.

FIGS. 4A to 4D illustrate the embodiment that may use the time span A shown in FIG. 3 for etching SiN while SiCN and SiOCN serve as etch stop materials. As shown in FIG. 4A, a semiconductor structure may include a plurality of source/drain regions 801 in the silicon substrate 80. A silicide 802 such as TiSi is disposed over some of the source/drain regions 801. A metal layer 803 made by W, Co or Ru is disposed over the silicide 802. The metal layer 803 is laterally surrounded by a bottom contact etch stop layer (BCESL) 804 made by higher temperature PEALD-grown SiN, a disposable layer 805 made by SiOCN or $SiO_2$, and a spacer 806 made by SiOCN. Furthermore, a plurality of metal gate structures 807 which include high-k material and metal gate stack are disposed adjacent to the spacers 806. In some embodiments, each of the metal gate structures 807 having a dielectric layer 808 therebelow and a contact layer 809 thereon. In some embodiments, a top of the disposable layer 805, a top of the spacer 806 and the contact layer 809 are covered by a self-align contact (SAC) 810 composed of, for example, lower temperature PEALD-grown SiN. In some embodiments, some of the source/drain regions 801 are covered by a plurality of cut metal gate structure 811 made by dielectric material.

Figure 4B:
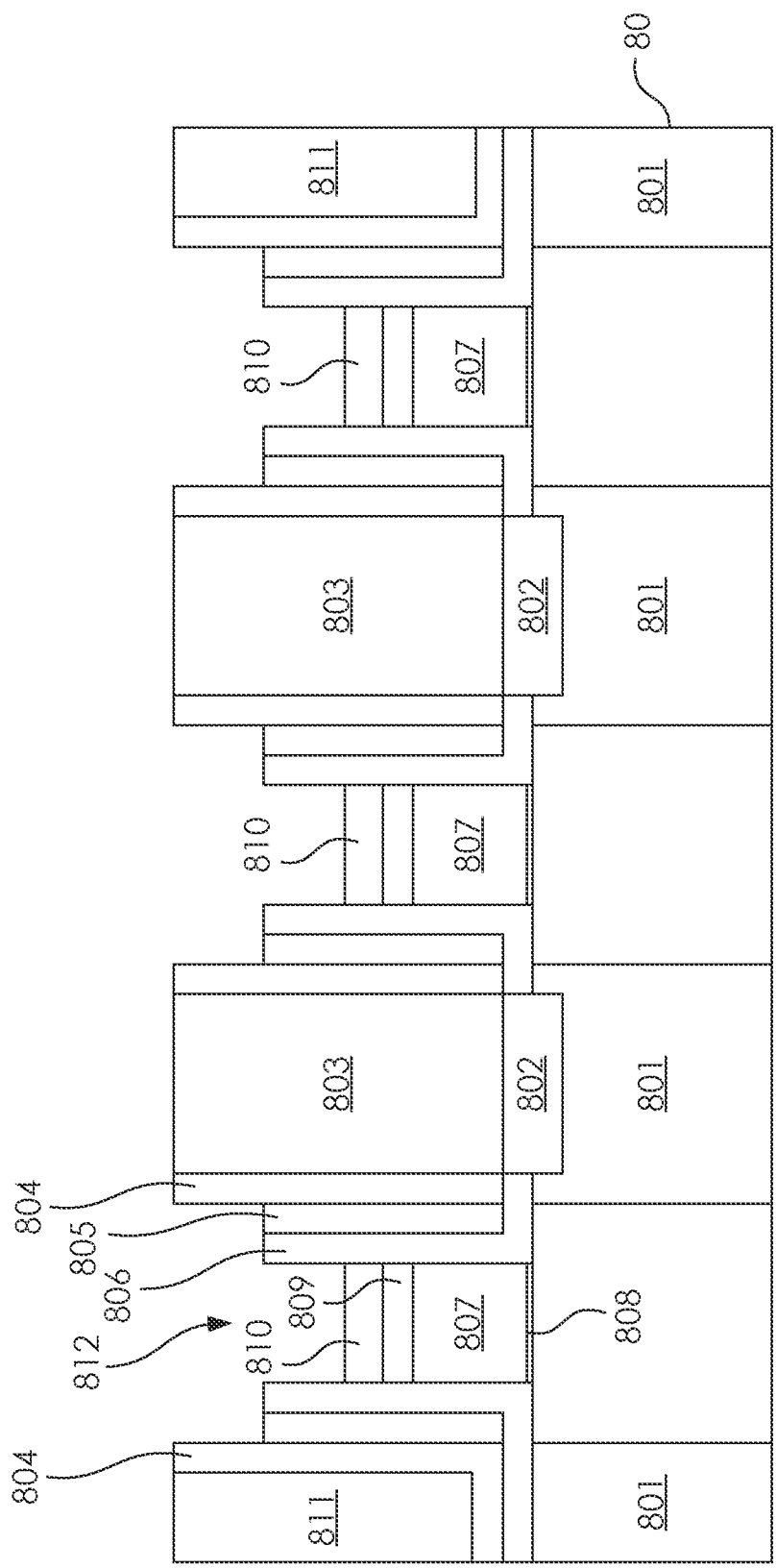
FIG. 4B illustrates a cross-sectional view of an intermediate semiconductor structure when performing the technique for semiconductor manufacturing, according to some embodiments of the present disclosure.

In such embodiments, as shown in FIG. 4B, the SAC 810 may be etched back to a thin layer over the contact layer 809. By using the FACS technique as aforementioned, for example, by controlling the duration of main etch operation to be greater than the incubation time of the material of the SAC 810 (i.e., SiN) and shorter than the incubation times of the materials nearby such as the disposable layer 805 (i.e., SiOCN or $SiO_2$), the material of the spacers 806 (i.e., SiOCN), and the metal layer 803 (i.e., W, Co or Ru), these materials nearby may thus serve as etch stop layers. In some embodiments, the etching selectivity between the SAC 810 and the spacer 806 is higher than about 20:1. In some embodiments, the etching selectivity between the SAC 810 and the metal layer 803 is higher than about 20:1. In some embodiments, the etching selectivity between the SAC 810 (i.e., lower temperature PEALD-grown SiN) and the BCESL 804 (higher temperature PEALD-grown SiN) is higher than about 10:1.

Although the BCESL 804 is composed of SiN, since the BCESL 804 may be formed by plasma-enhanced atomic layer deposition (PEALD) with a deposition temperature higher than that forming the SAC 810, the incubation time of the BCESL 804 to the etching chemistry is greater than that of the SAC 810 to the same etching chemistry. In some embodiments, the SAC 810 is formed by PEALD with a temperature in a range of from about 400 Celsius degrees to about 500 Celsius degrees, while the BCESL 804 is formed by PEALD with a temperature higher than about 500 Celsius degrees, for example, of about 550 Celsius degrees. As shown in FIG. 4B, a recess 812 formed by the etched back of the SAC 810 may have a depth in a range of from about 8 nm to about 10 nm, for example, of about 9 nm.

Figure 4C:
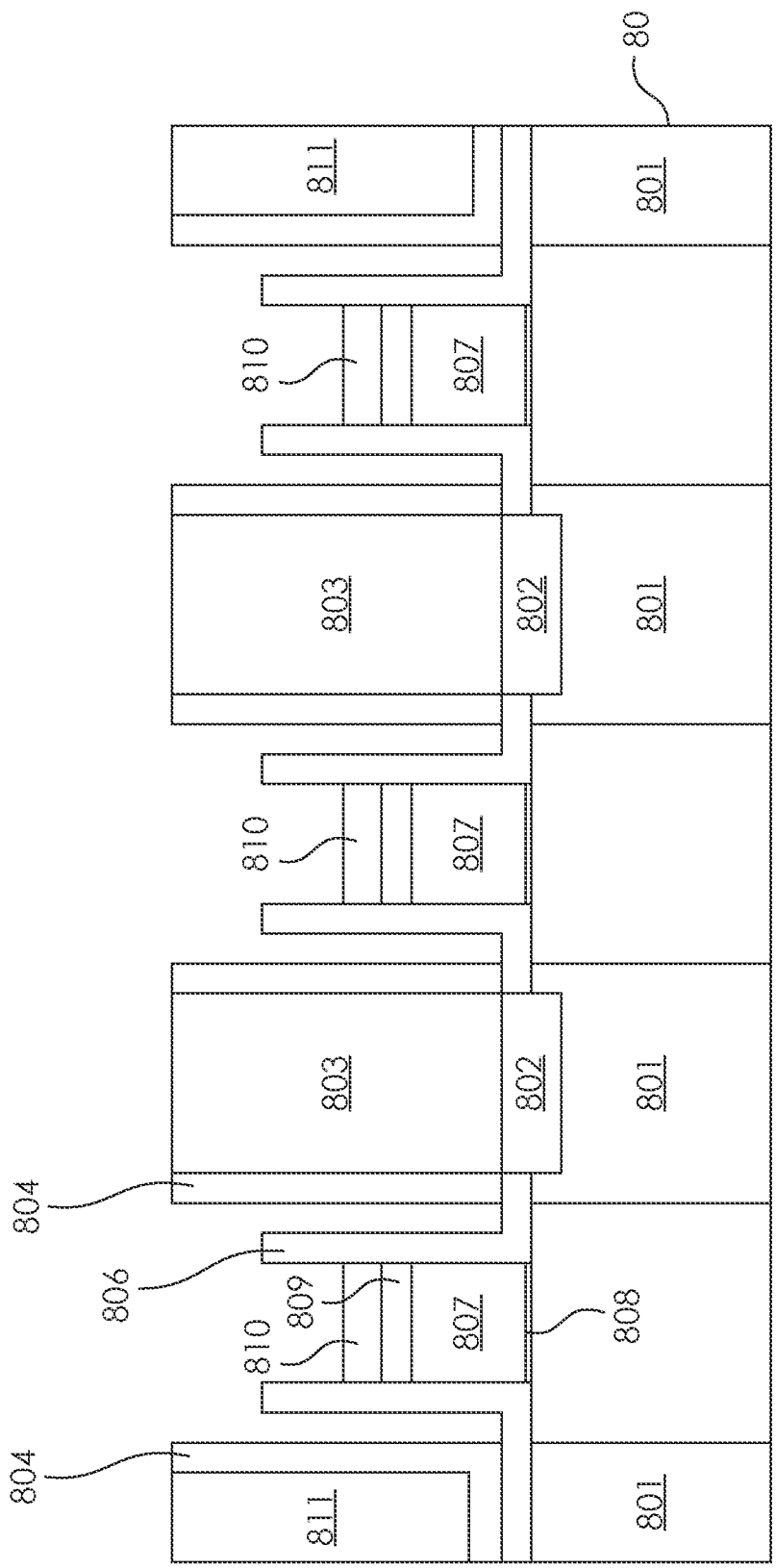
FIG. 4C illustrates a cross-sectional view of an intermediate semiconductor structure when performing the technique for semiconductor manufacturing, according to some embodiments of the present disclosure.
Figure 4D:
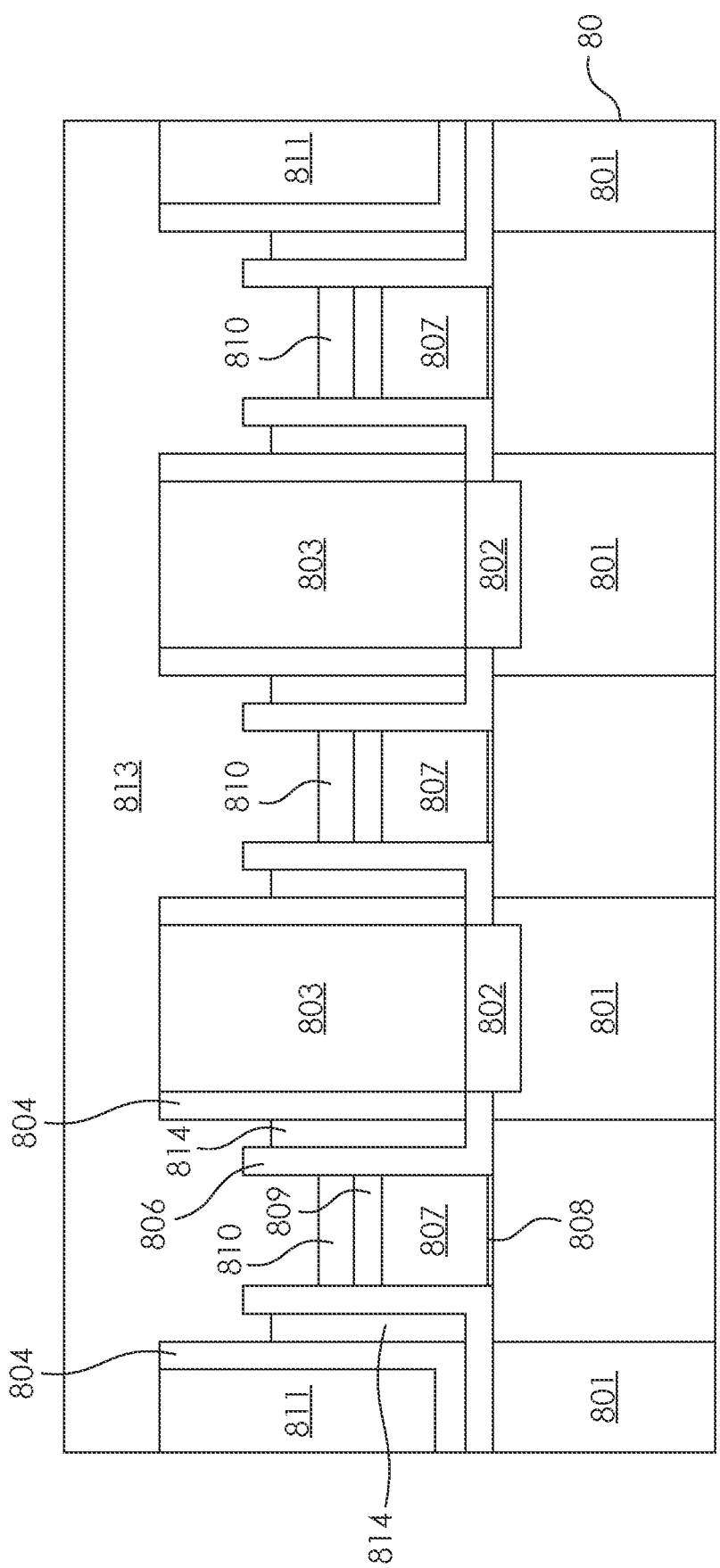
FIG. 4D illustrates a cross-sectional view of an intermediate semiconductor structure when performing the technique for semiconductor manufacturing, according to some embodiments of the present disclosure.

As shown in FIG. 4C, in some embodiments, the disposable layer 805 may be further removed in a disposable layer removal operation, and a plurality of air gaps 814 may be formed between the BCESL 804 and the spacers 806. As shown in FIG. 4D, in some embodiments, a flowable STI layer 813 is spun on to seal the air gaps 814 and providing an extreme low-k layer (i.e., the air gap 814) in the structure.

Figure 5:
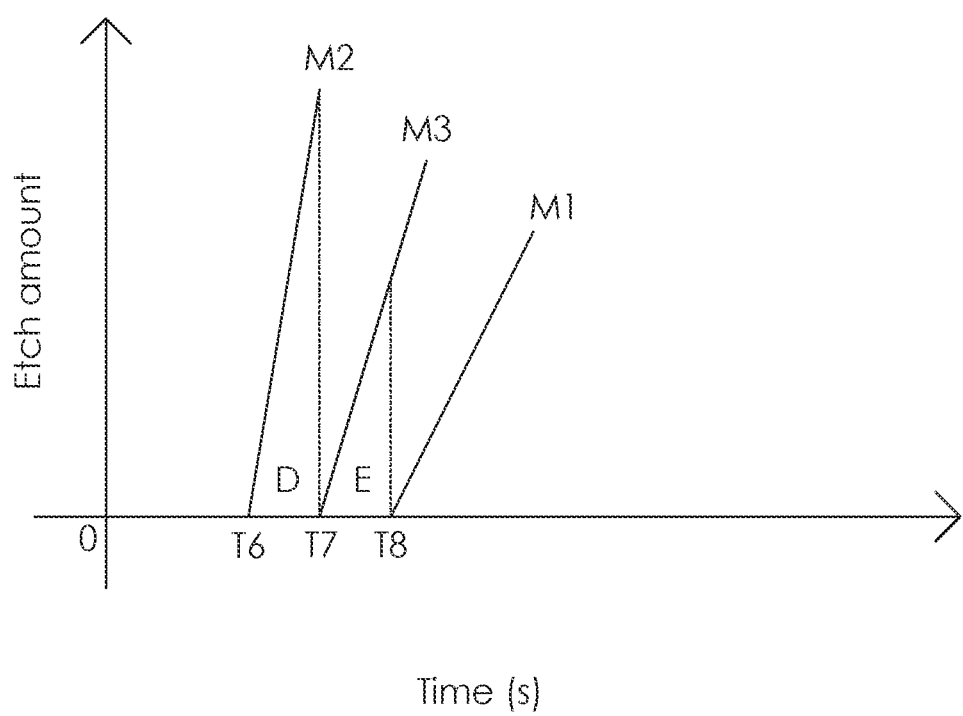
FIG. 5 illustrates a diagram showing etching amount with respect to etching duration for different material species according to some embodiments of the present disclosure.

As shown in FIG. 5, the incubation times of the materials species M1 M2, M3 previously shown in FIG. 3 may be changed by replacing the first etching chemistry with a second etching chemistry. That is, the order of the incubation times of the materials species M1, M2, M3 may be changed by altering the etching chemistry. In some embodiments, the second etching chemistry may generate nitrogen radicals, hydrogen radicals, and oxygen radicals, and etching gases such as $N_2$, or $NH_3$, $H_2$, $O_2$ or $CO_2$ can be used.

As shown in FIG. 5, the order of the incubation times for the material species M1, the material species M2, and the material species M3 is changed by using the second etching chemistry. For instance, as previously described in FIG. 3, the material species M2 can be SiCN, and the material species M3 can be SiOCN. Under the second etching chemistry, SiCN has a shorter incubation times T6 than the incubation time T7 of SiOCN. For example, incubation times T6 and T7 are about 1.0 second and 1.5 seconds respectively, while the material species M1, SiN, has a longer incubation time T8 of about 2.0 seconds. Accordingly, when the duration of the main etch falls within the time span D, SiCN is etched while SiOCN and SiN can serve as etch stop materials. Likewise, when the duration of the main etch falls within the time span E, both SiCN and SiOCN are etched while SiN can serve as an etch stop material.

As previously discussed, currently each of the etching cycles/periods in CDE is no less than about 3 seconds by taking uniform chemisorption and plasma stability into consideration. Referring to FIG. 3, under the first chemistry scenario, when the duration of the main etch is to be greater than about 3 seconds, only the fifth material M5 (i.e., $SiO_2$) can be used as an etch stop material with high selectivity because such long duration of the main etch exceeds the incubation time of most of the material species shown in FIG. 3. Likewise, referring to FIG. 5, under the second chemistry scenario, when the duration of the main etch is greater than about 3 seconds, no material can be used as an etch stop material with high etching selectivity because such long duration of main etch exceeds the incubation time of all the material species shown in FIG. 5. Present disclosure provides an alternate technique for CDE capable of adopting a shorter main etch duration, for example, less than about 1 second, such that all the material species listed in FIG. 3 and FIG. 5 can be utilized as an etch stop layer with high etching selectivity.

In other words, each of the materials has a specific incubation time to a specific etching chemistry, and accordingly, the present disclosure may utilize the orders of the incubation times to enable high etch selectivity and reversible etching technique. That is, the present disclosure may broaden the applicability of the etching apparatus under the fact that a single etching apparatus may thus be used to provide multiple etching modes.

For example, when a variety of etching chemistries can be integrated to one etching apparatus, the wafers under process are no longer required to transfer from one etching chamber providing one or few etching chemistries to another etching chamber providing other one or other few etching chemistries when the material intended to be etched is changed along the manufacturing operations. Generally, a single etching apparatus can only be used to implement one or few etching operations (e.g., the first material is etched and the second material serves as etch stop) and the wafers have to be moved to another etching apparatus to implement another one or few etching operations (e.g., the second material is etched and the third material serves as etch stop). As the chart shown in 3 and FIG. 5, each of the materials intended to be etched may be etched by different etching chemistries with different incubation times, and therefore it is feasible to perform a reversible etching selectivity operations without transferring the wafer from one etching apparatus to another etching apparatus. For example, under the first etching chemistry of FIG. 3, when performing the main etch with a duration falls within the time span A, material species M1 (e.g., SiN) is etched while material species M2 (e.g., SiCN) and material species M3 (e.g., SiOCN) serve as etch stop with high etching selectivity. Without transferring the wafer to another chamber, the etching chamber performing the etching of the material species M1 can change to the second etching chemistry of FIG. 5, when performing the main etch with a duration falls within the time span D or E, material species M2 (e.g., SiCN) and material species M3 (e.g., SiOCN) are etched while species M1 (e.g., SiN) reversibly serve as etch stop with high etching selectivity.

Figure 6:
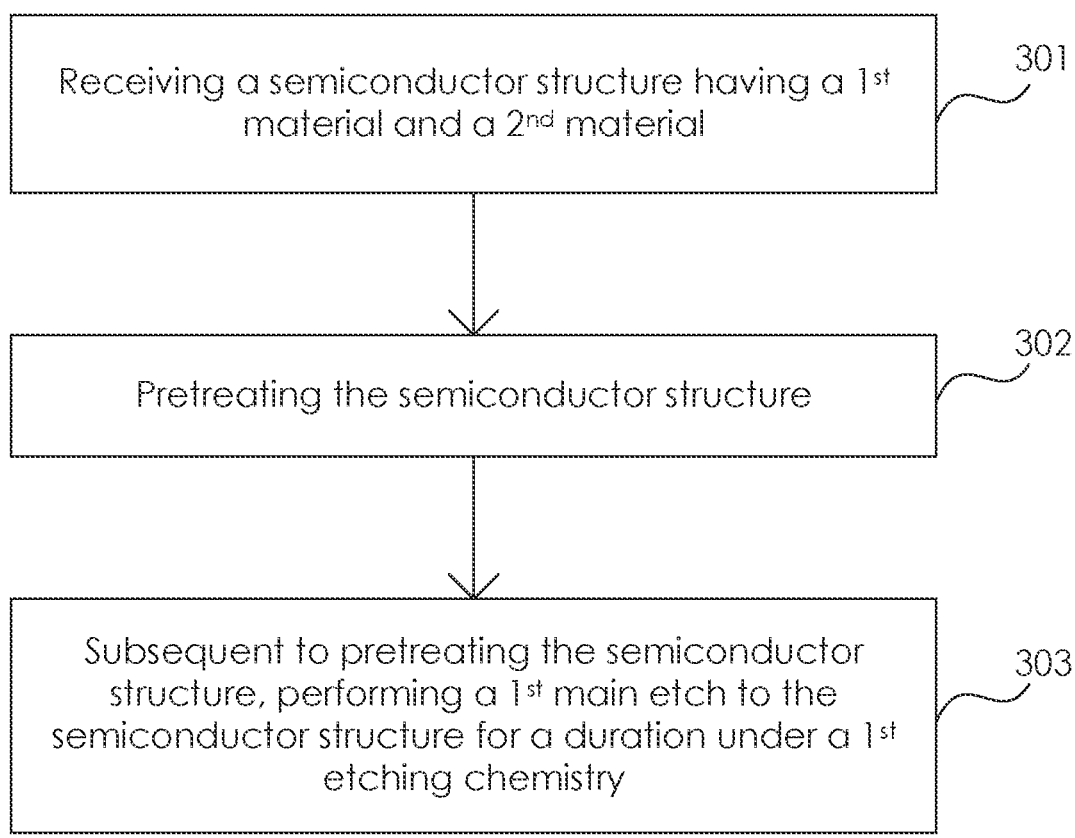
FIG. 6 illustrates a flow chart of a technique for semiconductor manufacturing, according to some embodiments of the present disclosure.

In order to shorten the duration of main etch from the conventional approach greater than 3 seconds to, for example, 1 second in the FACS technique described herein, a pretreatment to the semiconductor structure prior to the main etch operation can be implemented. In some embodiments, as shown in FIG. 6, the manufacturing technique may include operation 301: receiving a semiconductor structure having a first material and a second material; an operation 302: pretreating the semiconductor structure; and an operation 303: subsequent to pretreating the semiconductor structure, performing a first main etch to the semiconductor structure for a duration under a first etching chemistry. In such embodiments, the first material and the second material having different incubation times under the first etching chemistry. Furthermore, the pretreatment to the semiconductor structure prior to the first main etch allows the shortening of the duration of the main etch so that the duration of the main etch can be shorter than one of the incubation times that provides high etching selectivity to the first material and the second material.

Figure 7A:
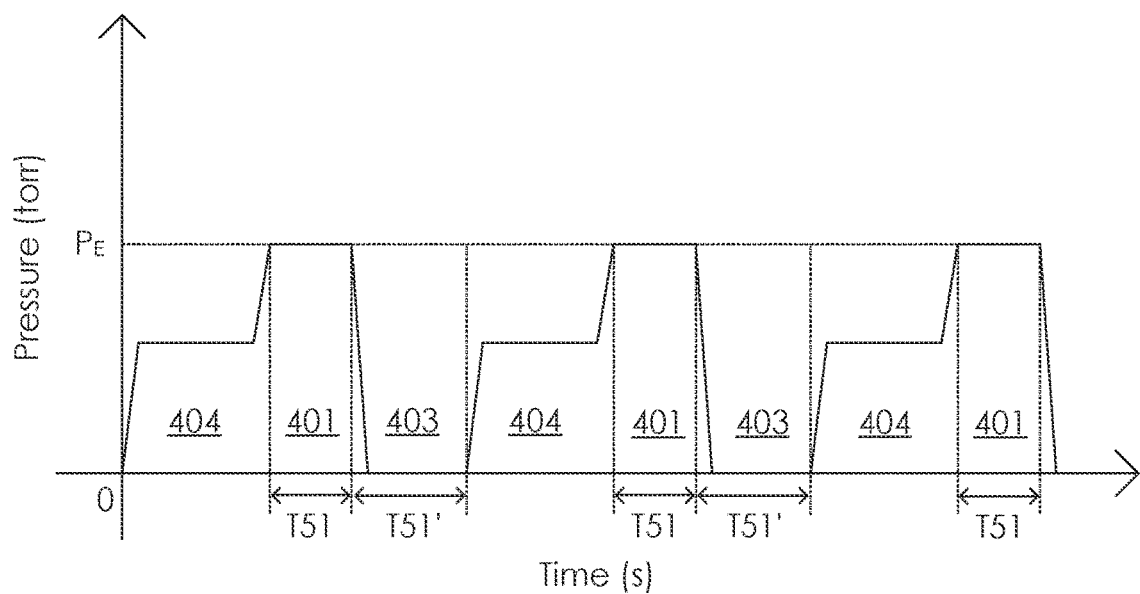
FIG. 7A illustrates a diagram showing etching pressure with respect to etching duration and pumping duration according to some embodiments of the present disclosure.

As shown in FIG. 7A, in some embodiments, the FACS technique disclosed in the present disclosure may include a plurality of first main etches 401 in a cyclic etching fashion. Prior to each of the first main etches 401, the etching chemistry may be applied into the etching chamber and therefore the pressure is increased to reach a suitable etching pressure $P_E$. In some embodiment, the etching pressure $P_E$ of performing the first main etch 401 is greater than about 10 Torr. Generally, a higher etching pressure may enhance etching selectivity, for example, the etching selectivity of $SiO_2$/SiN may be enhanced from about 20 to about 140 when the etching pressure is increased from lower than 3 Torr to greater than 10 Torr. On the other hands, the increasing of the etching pressure may increase the flow rate of the etching gas, and the step (a) in the incubation time (i.e., gas phase diffusion) as aforementioned may be accelerated. Moreover, a higher flow rate of the etching gas may increase the etch rate by accelerating the absorption/desorption process of the reactants. By increasing the etching pressure $P_E$ or the flow rate of the etching gas, the duration of the main etch implemented in the embodiments of present disclosure can be reduced. In addition, the etching pressure $P_E$ applied may also lead to reduction of the incubation time of the corresponding material species.

As shown in FIG. 7A, in some embodiments, the manufacturing technique may further include a pumping period 403 between first main etches 401 in sequential order. During the pumping period 403, the etching chemistry may be pumped out from the etching chamber and therefore the pressure in the etching chamber may be decreased to about zero.

Still referring to FIG. 7A, in some embodiments, the manufacturing technique may further include a plurality of pretreatments 404 to the etching surface prior to each of the first main etches 401. The pretreatments 404 applied to the etching surface may include one of a catalyzing operation, a surface cleaning operation, or a passivation operation. The application of catalyst, for example, hydrogen radicals, can affect the activation energy of atoms surface diffusion, and therefore may shorten the incubation time and allows the corresponding main etch to achieve a stable etching state quickly. On the other hand, applying surface cleaning to the etching surface during pretreatment 404 can effectively remove the unreacted chemical or undesorbed products from the etching surface prior to the subsequent main etch. For example, the etching byproducts such as fluorine or chlorine absorbed on the surface of the etching surface can be removed during the pretreatment 404. In some embodiments, the pretreatment 404 may include applying gas sources such as HF, $NH_3$, $F_2$, $NF_3$, $H_2O$, $H_2$, $CH_4$, $Cl_2$, $SiCl_4$, $FCl_3$, $CH_3F$, $O_2$, $BCl_3$, $N_2$, and the like, to the etching surface, depending on the etching chemistry and the material species of the etching surface. On the other hand, applying passivation gas, for example, polymeric gas, to the etching surface during pretreatment 404 can serve the purpose of seam-filling for some etching surface morphologies.

Referring back to FIG. 7A, the increase of etching pressure $P_E$ and the implementation of pretreatments 404 can effectively reduce the duration of main etch, thereby allowing incubation time engineering that leads to high and reversible selectivity etching result. As previously described in FIG. 3, by using the first etching chemistry, the duration of the main etch in the present disclosure can be controlled within the time span A, hence only predetermined materials in the semiconductor structure may be etched without consuming or affecting the profiles of other materials having longer incubation times to the first etching chemistry. In some embodiments, each of the first durations T51 (i.e., the duration of the first main etch) is less than about 3.0 seconds. In some embodiments, each of the first durations T51 is in a range of from about 1 second to about 2.5 seconds. Compared to the conventional CDE approach where the duration of the main etch is greater than about 3 seconds, the corresponding pumping period may be within a range of from about 5 seconds to about 180 seconds. However, when applying the FACS technique as described herein, because the first duration T51 is reduced, the pumping duration T51' can be reduced, for example, from about 5 seconds to about 60 seconds. Shorter pumping duration T51' and more frequent pumping period 403 can lead to the advantage of etching profile decoration, as will be discussed in FIG. 9A to FIG. 9B and FIG. 10A to FIG. 10C of the present disclosure.

Figure 7B:
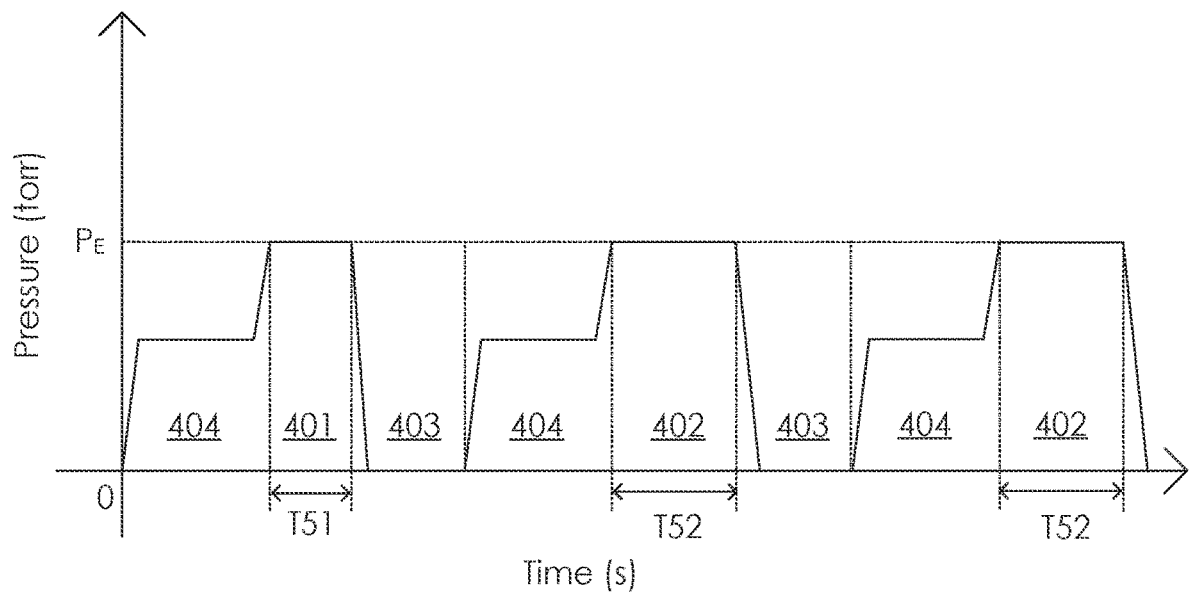
FIG. 7B illustrates a diagram showing etching pressure with respect to etching duration and pumping duration according to some embodiments of the present disclosure.

As shown in FIG. 7B, in some embodiments, at least one second main etch 402 to the etching surface may be performed for a second duration T52 (i.e., the duration of the second main etch 402) subsequent to performing the first main etch 401. In some embodiments, the second duration T52 is greater than the first incubation time (e.g., time span A in FIG. 3) but shorter than the second incubation time (e.g., time span B in FIG. 3). In some embodiments, each of the second durations T52 are less than about 3.0 seconds. In some embodiments, each of the second durations T52 are in a range of from about 1 second to about 2.5 seconds. In some embodiments, the second duration T52 is substantially identical to the first duration T51. In other words, in some embodiments, the second main etch 402 may be substantially identical to the first main etch 401 and thus the first main etches 401 are substantially implemented repeatedly. In other embodiments, the first main etch 401 and the second main etch 402 may fall within different time spans under the same etching chemistry, such as previously mentioned in FIG. 3 or FIG. 5. Therefore, the materials intended to be etched during the first main etch 401 and the second main etch 402 may be different, and both the first main etch 401 and the second main etch 402 demonstrate high etching selectivity.

In some embodiments, the etching chemistry is altered from the first etch chemistry to the second etch chemistry and thus the reversible etching technique that broaden the applicability of the etching apparatus as previously described may be performed. In such embodiments, the second material serves as an etch stop material to the first etching chemistry during the first main etch 401 and may be changed to be the material intended to be etched during the second main etch 402. In such embodiments, the first duration T51 and the second duration T52 can be independently determined because the first main etch 401 and the second main etch 402 are implemented under different etching chemistries and the incubation time corresponding to respective material species may be different as the previously shown in FIG. 3 and FIG. 5.

Figure 8:
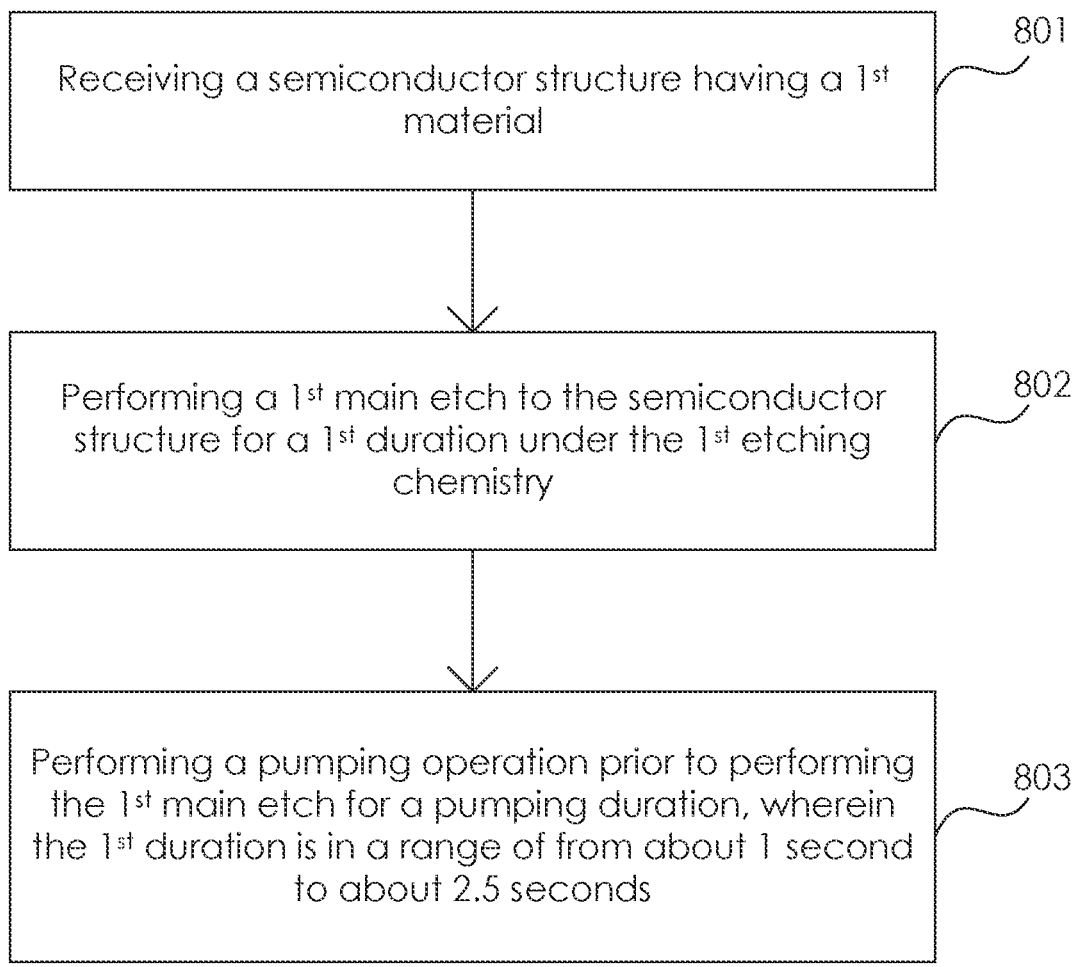
FIG. 8 illustrates a flow chart of a technique for semiconductor manufacturing, according to some embodiments of the present disclosure.

In some embodiments, the FACS technique may be used for profile decoration, for example, de-smiling, reduce surface roughness, and greater etched surface uniformity. As shown in FIG. 8, the FACS technique may include an operation 801: receiving a semiconductor structure having a first material; an operation 802: performing a first main etch to the semiconductor structure for a first duration under the first etching chemistry; and operation 803: performing a pumping operation prior to performing the first main etch for a pumping duration, wherein the first duration is in a range of from about 1 second to about 2.5 seconds.

Figure 9A:
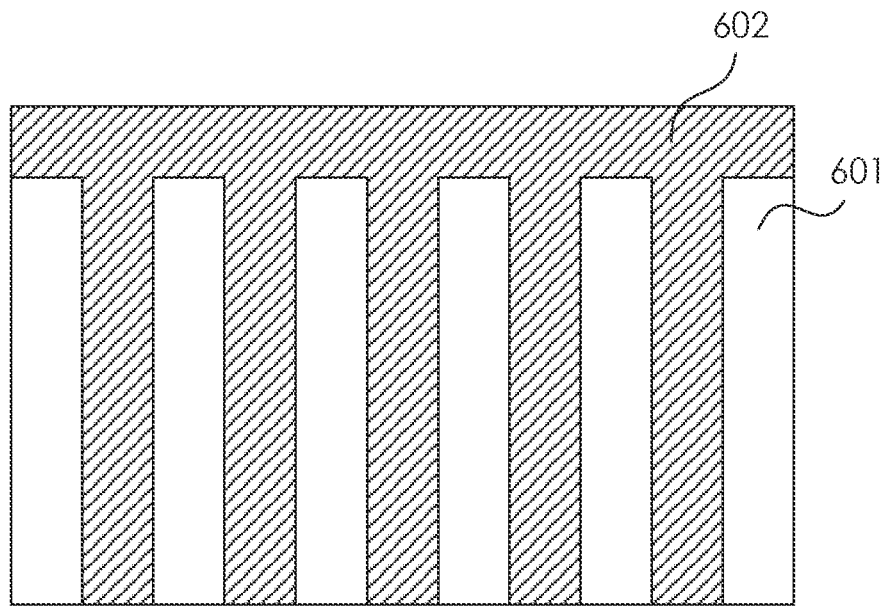
FIG. 9A illustrates a cross-sectional view of an intermediate semiconductor structure when performing the technique for semiconductor manufacturing, according to some embodiments of the present disclosure.
Figure 9B:
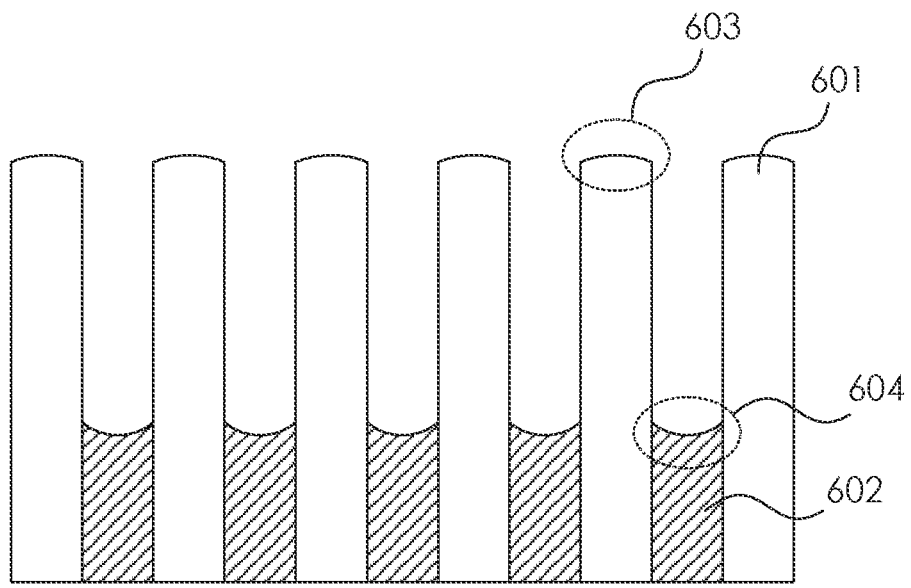
FIG. 9B illustrates a cross-sectional view of an intermediate semiconductor structure when performing the technique for semiconductor manufacturing, according to some embodiments of the present disclosure.
Figure 9C:
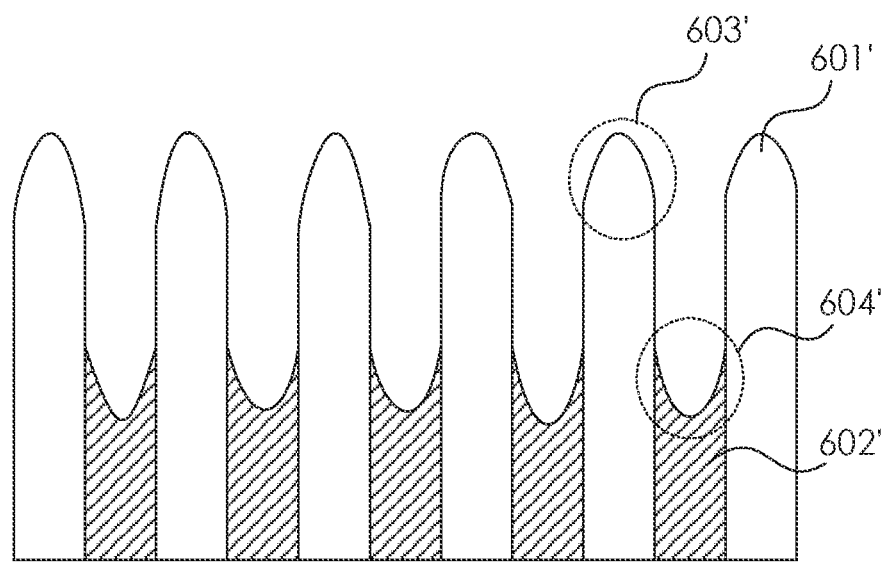
FIG. 9C illustrates a cross-sectional view of an intermediate semiconductor structure without using the technique, according to some comparative embodiments of the present disclosure.

FIG. 9A to FIG. 9B shows an etching operation to form closely arranged nitride hard mask 601 by removing surrounding oxide material 602. By implementing the FACS technique described herein, the reduced duration of main etch allows more frequent pumping periods and greater number of cyclic etching per unit time, therefore, a better surface profile of the nitride hard mask 601 can be obtained. As shown in FIG. 9A, in some embodiments, a plurality of nitride hard mask 601 are formed and the gaps therebetween are subsequently filled with oxide material 602. A top surface of the oxide material 602 may be higher than a top surface of the plurality of nitride hard mask 601. In FIG. 9B, by utilizing HF/NH$_3$ etching chemistry and controlling the duration of the main etch to be greater than the incubation time of the oxide material 602 and shorter than the incubation time of the nitride hard mask 601, only the material of the oxide material 602 can have observable etching result after the etching operation. That is, by interrupting the etch before the nitride hard mask 601 started to show observable etching result, the profiles of the nitride hard mask 601 may be maintained without observable material consumption in any form as if a longer main etch duration was adopted. For example, the profiles of the nitride hard mask 601 in the regions 603 that close to the tops of the nitride hard mask 601 may be maintained as much as possible. For example, the planar profiles of the nitride hard mask 601 in the regions 603 and the planar profile of the post-etch oxide material 602 in the region 604 may be substantially preserved after etching under the FACS technique. In contrast, as shown in FIG. 9C, under the circumstances that conventional CDS approach is adopted, rounded post-etch profile of the nitride hard mask 601' in the region 603' may be observed. Meanwhile, prominent smiling profile of the post-etch surface of the oxide material 602' in the region 604' can be observed when utilizing conventional CDE approach.

Figure 10A:
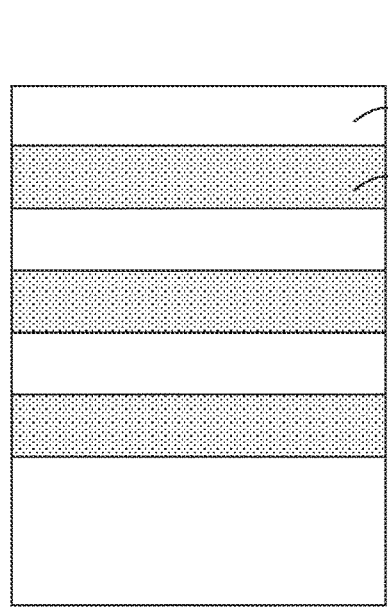
FIG. 10A illustrates a cross-sectional view of an intermediate semiconductor structure when performing the technique for semiconductor manufacturing, according to some embodiments of the present disclosure.
Figure 10B:
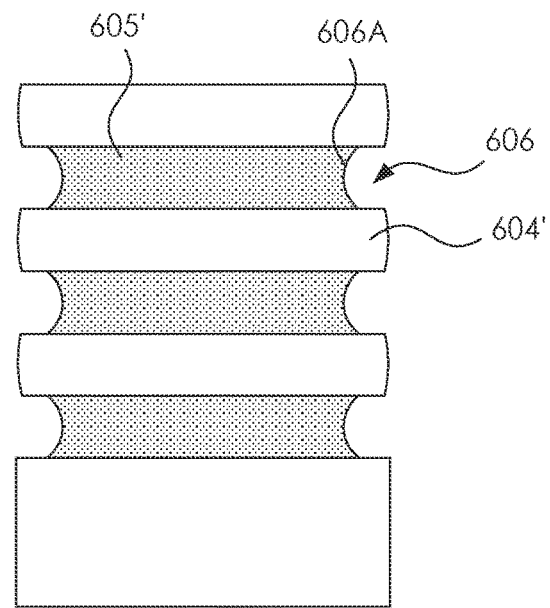
FIG. 10B illustrates a cross-sectional view of an intermediate semiconductor structure when performing the technique for semiconductor manufacturing, according to some embodiments of the present disclosure.
Figure 10C:
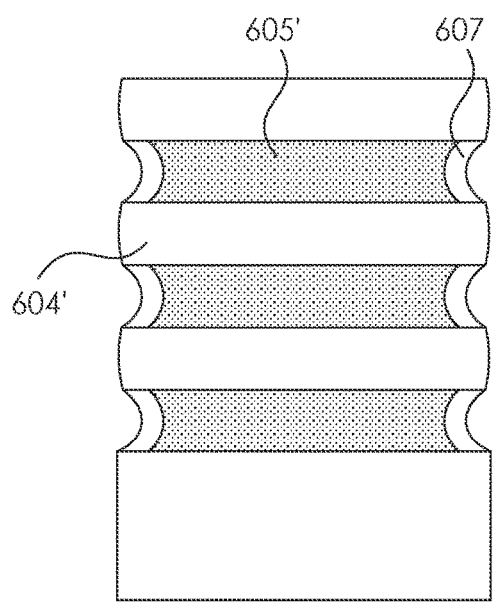
FIG. 10C illustrates a cross-sectional view of an intermediate semiconductor structure when performing the technique for semiconductor manufacturing, according to some embodiments of the present disclosure.
Figure 10D:
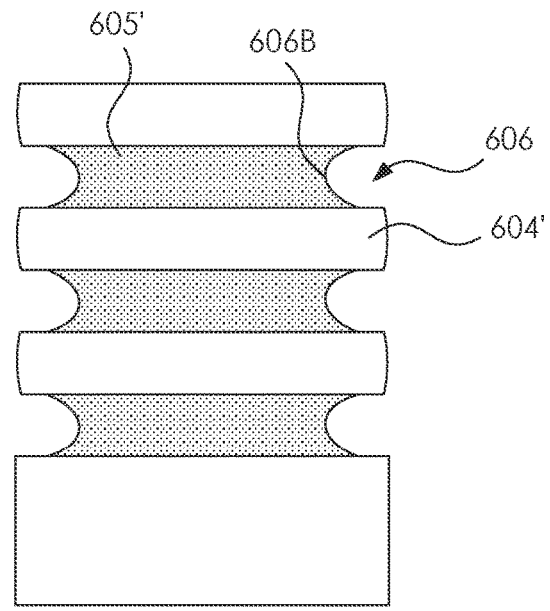
FIG. 10D illustrates a cross-sectional view of an intermediate semiconductor structure without using the technique, according to some comparative embodiments of the present disclosure.

FIG. 10A to FIG. 10C show etching operations to recess SiGe layer 605 from the SiGe/Si stack. By implementing the FACS technique described herein, the reduced duration of main etch allows more frequent pumping periods and greater number of cyclic etching per unit time, therefore, a better surface profile of the SiGe layer can be obtained. As shown in FIG. 10A, in some embodiments, the stacked Si layers 604 and SiGe layers 605 are formed. In FIG. 10B, Si nano-sheets 604' is preliminary released by a plurality of SiGe recesses 606. In such embodiments, HF/F$_2$ may be used as the etching chemistry and a portion of the SiGe layers 605 is etched under the FACS technique to form the partially etched SiGe 605' and the SiGe recesses 606. The SiGe recesses 606 may be covered with inner spacers 607 subsequently. By using the FACS technique, etching selectivity between SiGe layers 605 and Si layers 604 is high and the etch front of each of the SiGe recesses 606 may preserve a substantially vertical planar profile than the structure obtained by conventional CDE approach. For instance, the etch front 606A of the SiGe recess 606 formed under the FACS technique may have a lower curvature (larger radius of curvature), while the etch front 606B (as shown in FIG. 10D) of the SiGe recess 606 formed by conventional CDE approach may have a greater curvature (smaller radius of curvature). In other words, the phenomenon regarding the decelerated etching around the corners of the recesses may be alleviated by the FACS technique. Therefore, the electrical and other performance of the semiconductor structures may be ensured. In some embodiments, the inner spacers 607 may be deposited on the profiles of the SiGe recesses 606, and further be trimmed by FACS technique subsequently. In some embodiments, the substantially vertical sidewall profiles of the Si nano-sheets 604' may be maintained as much as possible under the FACS technique.

To be more detailed, by using the FACS technique, the smiling profile (i.e., the extent of recess is greater at the center and smaller at the corner) at the etch front may be alleviated. Because the byproducts of etching may cluster at the kinks or the steps of the semiconductor structure, for example, as the embodiments shown in FIG. 9B and FIG. 10B, the byproducts such as (NH$_4$)$_2$SiF$_6$ formed from SiO$_2$ etching and Ge residues formed from SiGe etching may be adsorbed on the surfaces in proximity to the corners of the STI recesses and the SiGe recesses respectively. Due to the stable clusters formed at the corners of the recesses, the etching chemistry may not access the material intended to be etched and thus the etching rate at the corner is lower than that around the centers of the recesses. To be more detailed, the lowering of the etching rate is highly related to the length of etching duration, because the longer of the etching duration is, the more byproducts are clustered at the kinks or the steps of the etching surface. Accordingly, by using the FACS technique, the duration of main etch cycle is limited to be shorter than the incubation times of predetermined materials to the etching chemistry. Therefore, the byproducts may be removed shortly and repeatedly through the pumping periods 403 and the pretreatment 404 shown in FIG. 7A and FIG. 7B. That is, the FACS technique may cyclically clean the byproducts at the kinks or the steps of the semiconductor structure and thus alleviate the forming of the smiling curves.

Furthermore, more pumping periods 403 provided by the FACS technique also may benefit to reducing roughness of the etch front 606B of the SiGe layers 605. In contrast to silicon components, it is harder to remove germanium components from the SiGe layer 605 under the etching chemistry. In other words, Ge removal efficiency is poor and Ge islands may be remained at the etch front of the etched SiGe 605', thereby causing poor surface roughness at the etch front. Accordingly, in some embodiments, by implementing more frequent pumping periods 403 as described in FIGS. 7A and 7B, Ge removal efficiency can be increased and hence the surface roughness decreased. In some embodiments, as illustrated in FIG. 10B, the roughness of the etch front 606A can be less than about 4 nm, for example, around or less than 3.5 nm. In some embodiments, the roughness of the etch front 606A may be reduced by increasing the frequency of pumping periods and the number of cyclic etching per unit time.

Figure 11A:
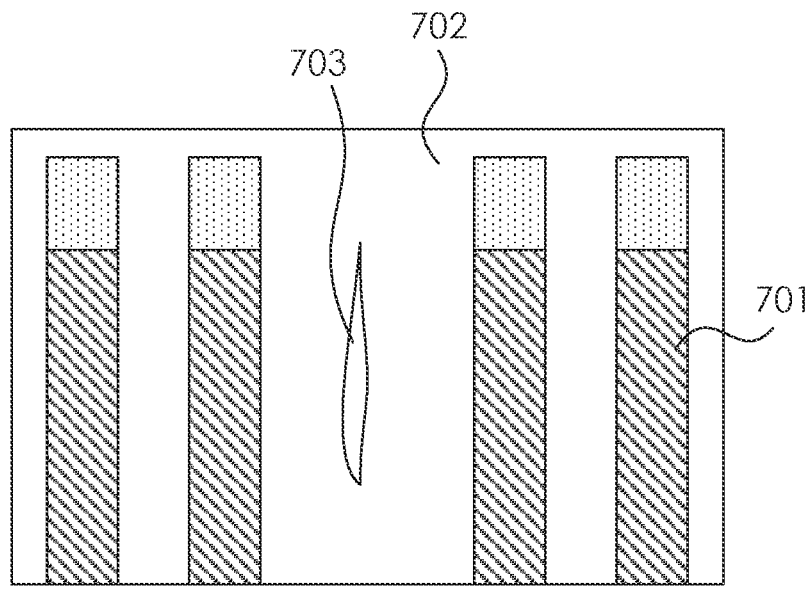
FIG. 11A illustrates a cross-sectional view of an intermediate semiconductor structure when performing the technique for semiconductor manufacturing, according to some embodiments of the present disclosure.
Figure 11B:
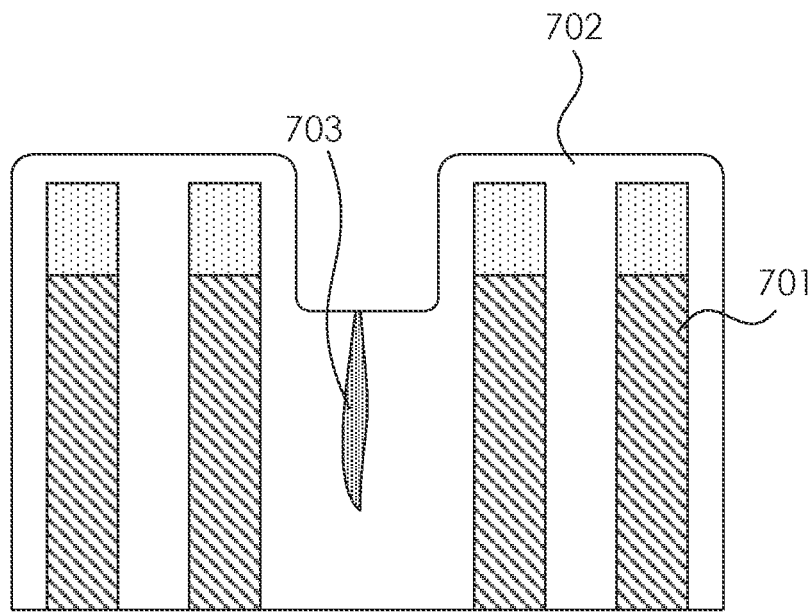
FIG. 11B illustrates a cross-sectional view of an intermediate semiconductor structure when performing the technique for semiconductor manufacturing, according to some embodiments of the present disclosure.

FIG. 11A and FIG. 11B show etching operations to recess SiGe layer 605 from the SiGe/Si stack. By implementing the FACS technique described herein, the reduced duration of main etch allows more frequent pumping periods and greater number of cyclic etching per unit time, therefore, a better surface profile of the SiGe layer can be obtained. As shown in FIG. 11A and FIG. B, in some embodiments, a plurality of fins 701 is covered by low-k material 702 such as SiCN or SiOCN. During the formation of the low-k material 702, seams 703 can be observed by virtue of adopting atomic layer deposition (ALD). In such embodiments, during the etch back of the low-k material 702, the buried seams 703 can be filled by using the passivation operation during the pretreatment 404 applied in the FACS technique shown in FIG. 7A and FIG. 7B. The materials used in passivation operation of the pretreatment 404 may include polymer-forming gases including components of $CH_4$ or $SiCl_4$ so that the byproducts may fill the seams 703 as much as possible. As a result, the structural defects due to ALD operations may be cured by the FACS technique by preventing a greater etching rate nearby the seams 703.

According to the present disclosure, a method or a technique for semiconductor manufacturing is disclosed. The method includes Fast Assess Cyclic Switching (FACS) technique which interrupts the etching operation prior to the end of the incubation times of etch stop materials, and thus the etching is terminated prior to those etch stop materials start having observable etching result. Accordingly, a new approach for chemical dry etch (CDE) by controlling an extra tuning knob, that is, the incubation time engineering, in addition to the conventional tuning knobs for CDE (chemistry, temperature, cyclic fashion with each main etch cycle greater than 3 seconds), may be used to achieve the etching requirement in advanced technology. FACS technique may be implemented on many etching applications such as forming STI recesses, forming SiGe recess, trimming inner spacer in SiGe recess, forming buried power rail inner spacer air (i.e., to remove the SiCN inner spacer in the buried power rail structure to form an air gaps therein), forming via back-side recess, etc. Moreover, by changing the specific etching chemistry under FACS technique, the materials to be etched and the etch stop material can be switched, without transferring the processing wafer from one etching apparatus to another etching apparatus. In other words, by shortening the minimum acceptable main etch duration per cycle to less than about 3 seconds, FACS technique enables extreme high and reversible selectivity through incubation time engineering and advanced profile decoration skills including de-smiling, depth variation and surface roughness control, and therefore the yield and the performance of the semiconductor structure may be improved.

In one exemplary aspect, a technique for semiconductor manufacturing is provided. The technique includes the operations as follows. A semiconductor structure having a first material and a second material is received. The first material has a first incubation time to a first etching chemistry. The second material has a second incubation time to the first etching chemistry. The first incubation time is shorter than the second incubation time. A first main etch to the semiconductor structure for a first duration by the first etching chemistry is performed. The first duration is greater than the first incubation time and shorter than the second incubation time.

In another exemplary aspect, a technique for semiconductor manufacturing is provided. The technique includes the operations as follows. A semiconductor structure having a first material and a second material is received. The first material having a first incubation time and the second material having a second incubation time greater than the first incubation time under a first etching chemistry. The semiconductor structure is pretreated. A first main etch is performed to the semiconductor structure for a duration under the first etching chemistry subsequent to pretreating the semiconductor structure.

In yet another exemplary aspect, a technique for semiconductor manufacturing is provided. The technique includes the operations as follows. A semiconductor structure having a first material is received. A plurality of first main etches are performed to the semiconductor structure for a plurality of first durations under the first etching chemistry. A plurality of pumping operations are performed for a plurality of pumping durations, each of the pumping operations being prior to each of the first main etches. Each of the first durations is in a range of from about 1 second to about 2.5 seconds.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A technique for semiconductor manufacturing, comprising:
receiving a semiconductor structure having a first material and a second material, the first material having a first incubation time to a first etching chemistry, the second material having a second incubation time to the first etching chemistry, and the first incubation time is shorter than the second incubation time; and
performing a first main etch to the semiconductor structure for a first duration by the first etching chemistry;
wherein the first duration is greater than the first incubation time and shorter than the second incubation time, and the second incubation time is less than about 3 seconds.

2. The technique of claim 1, further comprising performing a second main etch to the semiconductor structure for a second duration by the first etching chemistry subsequent to performing the first main etch, wherein the second duration is greater than the first incubation time and shorter than the second incubation time.

3. The technique of claim 2, wherein the second duration is substantially identical to the first duration.

4. The technique of claim 2, further comprising pretreating the semiconductor structure prior to the first main etch and the second main etch.

5. The technique of claim 2, wherein the second duration is greater than the first duration.

6. The technique of claim 1, wherein an etching pressure of performing the first main etch is greater than about 10 Torr.

7. The technique of claim 1, wherein the first duration is in a range of from about 1 second to about 2.5 seconds.

8. A technique for semiconductor manufacturing, comprising:
receiving a semiconductor structure having a first material and a second material, the first material having a first incubation time and the second material having a second incubation time greater than the first incubation time under a first etching chemistry;
pretreating the semiconductor structure; and
subsequent to pretreating the semiconductor structure, performing a first main etch to the semiconductor structure for a duration under the first etching chemistry;
wherein the duration is in a range of from about 1 second to about 2.5 seconds.

9. The technique of claim 8, further comprising performing a plurality of second main etches to the semiconductor structure.

10. The technique of claim 9, further comprising a plurality of pumping periods each following the first main etch or each of the second main etches.

11. The technique of claim 9, further comprising a plurality of pretreating the semiconductor structure, each pretreating being prior to each of the second main etches.

12. The technique of claim 9, wherein each of the second main etches lasts a duration different from the duration of the first main etch.

13. The technique of claim 8, wherein the pretreating comprises one of a surface cleaning operation, a passivation operation, or a catalyzing operation.

14. The technique of claim 8, wherein an etching pressure of performing the first main etch is greater than about 10 Torr.

15. The technique of claim 8, wherein the duration is greater than the first incubation time and shorter than the second incubation time.

16. A technique for semiconductor manufacturing, comprising:
receiving a semiconductor structure having a first material and a second material, the first material having a first incubation time to a first etching chemistry, the second material having a second incubation time to the first etching chemistry, and the first incubation time is shorter than the second incubation time;
performing a first main etch to the semiconductor structure for a first duration by the first etching chemistry;
performing a pumping operation for a pumping duration after the first main etch; and
performing a second main etch to the semiconductor structure for a second duration by the first etching chemistry;
wherein the first duration is from about 1 second to about 2.5 seconds.

17. The technique of claim 16, wherein the first duration is greater than the first incubation time and shorter than the second incubation time.

18. The technique of claim 17, wherein the second duration is identical to the first duration.

19. The technique of claim 16, wherein the pumping duration is in a range of from about 5 seconds to about 60 seconds.

20. The technique of claim 16, wherein an etching pressure of performing the first main etch is greater than about 10 Torr.

* * * * *